(12) United States Patent
Still et al.

(10) Patent No.: US 8,333,011 B2
(45) Date of Patent: Dec. 18, 2012

(54) METHOD FOR MAKING AN ELECTRONIC ASSEMBLY

(75) Inventors: Charles Still, Clinton, MI (US); David R. Stoscup, Plymouth, MI (US)

(73) Assignee: Autoliv ASP, Inc., Ogden, UT (US)

( * ) Notice: Subject to any disclaimer, the term of this patent is extended or adjusted under 35 U.S.C. 154(b) by 0 days.

(21) Appl. No.: 13/121,896

(22) PCT Filed: Jul. 17, 2008

(86) PCT No.: PCT/US2008/070270
§ 371 (c)(1),
(2), (4) Date: Mar. 30, 2011

(87) PCT Pub. No.: WO2010/008389
PCT Pub. Date: Jan. 21, 2010

(65) Prior Publication Data
US 2011/0271522 A1    Nov. 10, 2011

(51) Int. Cl.
*H05K 3/36*        (2006.01)
(52) U.S. Cl. .................. 29/830; 29/825; 29/846
(58) Field of Classification Search ............ 29/825, 29/830, 846
See application file for complete search history.

(56) References Cited

U.S. PATENT DOCUMENTS

| | | | | |
|---|---|---|---|---|
| 5,053,357 A | * | 10/1991 | Lin et al. ................... | 29/593 |
| 5,428,190 A | * | 6/1995 | Stopperan .................. | 174/261 |
| 5,742,484 A | | 4/1998 | Gillette et al. | |
| 6,841,739 B2 | * | 1/2005 | Moore ........................ | 174/255 |
| 6,879,032 B2 | * | 4/2005 | Rosenau et al. ............ | 257/696 |
| 7,265,719 B1 | | 9/2007 | Moosbrugger et al. | |
| 7,292,448 B2 | * | 11/2007 | Urushibara et al. ......... | 361/748 |
| 7,606,042 B2 | * | 10/2009 | Goodwin .................... | 361/749 |
| 7,642,466 B2 | * | 1/2010 | Nikaido et al. ............. | 174/255 |
| 8,033,836 B1 | * | 10/2011 | Bhakta et al. ................ | 439/71 |
| 8,044,746 B2 | * | 10/2011 | Blair et al. .................... | 333/5 |
| 8,102,657 B2 | * | 1/2012 | Hiew et al. .................. | 361/737 |
| 2007/0003126 A1 | | 1/2007 | Case et al. | |

OTHER PUBLICATIONS

International Search Report from PCT/US2008/070270 Mailed Sep. 22, 2008.

* cited by examiner

*Primary Examiner* — Carl Arbes
(74) *Attorney, Agent, or Firm* — Sally J. Brown; Brinks Hofer Gilson & Lione

(57) ABSTRACT

In an embodiment of the present invention a method for making an electronic assembly is provided. The method comprises positioning a substrate having a plurality of segmented portions. A first segmented portion has a first plurality of conductive traces terminating to form a first plurality of conductive pads. A second segmented portion has a second plurality of conductive traces terminating to form a second plurality of conductive pads. A flex circuit is placed onto the conductive pads. The flex circuit includes a third plurality of conductive traces terminating at a first end to form a first plurality of connecting pads and terminating at a second end to form a second plurality of connecting pads. Electronic components are electrically coupled to the first and second plurality of conductive traces to form a primary PCB and a daughter PCB. The connecting pads are electrically coupled to the conductive pads for electrically coupling the daughter PCB to the primary PCB.

28 Claims, 5 Drawing Sheets

METHOD FOR MAKING AN ELECTRONIC ASSEMBLY

BACKGROUND

1. Field of the Invention

The present invention relates generally to a method for making an electronic assembly and more particularly, to a method for making an electronic assembly including a primary printed circuit board (PCB) and at least one daughter PCB electrically coupled to the primary PCB.

2. Background of the Invention

There is a continuing challenge in the electronic industry for making low cost, reliable printed circuit board (PCB) assemblies comprising at least two PCBs, such as a mother or primary PCB and a daughter or secondary PCB, with reliable interconnections between the PCBs. PCBs may be rigid, such as those having a substrate made of alumina or FR-4 glass/epoxy laminate, while others are relatively flexible (e.g., "flex circuits"), such as those having a substrate made of polyimide film, polyester film, polyetherimide (PEI) film and the alike.

The interconnection between the PCBs electrically connects the circuit traces of the first PCB to corresponding circuit traces on a second PCB. Traditionally, the electrical connections between closely positioned PCBs, e.g., closely stacked or parallel PCBs, have been achieved with rigid connectors. These are typically made of two mating halves, a male and a female, each having leads to attach to the PCB and receptacles captured in a rigid housing. One advantage of the rigid connectors is that various halves of the connectors are easily surface mountable and some degree of automation can be employed when they are attached to the PCB. However, they often require manual processes to mate the two PCBs to each other, and they are susceptible to mechanical failure due to stress induced by tolerance stack up, soldering and/or other assembly related processes, or by mechanical shock, e.g., being dropped onto a surface.

BRIEF SUMMARY OF THE INVENTION

In satisfying the above need and overcoming the above and other drawbacks and limitations of the known technology, the present invention provides a method for making an electronic assembly that includes a primary PCB and at least one daughter PCB which is electrically coupled to the primary PCB. The method comprises positioning a rigid substrate having a plurality of segmented portions connected together. The segmented portions include a first segmented portion, which is for the primary PCB, and a second segmented portion, which is for the daughter PCB. The first segmented portion has a first plurality of conductive traces terminating to form a first plurality of conductive pads. The second segmented portion has a second plurality of conductive traces terminating to form a second plurality of conductive pads. At least one electronic component is placed along each of the first and second plurality of conductive traces. A flex circuit is placed onto the first and second plurality of conductive pads. A third plurality of conductive traces are included on the flex circuit and terminate at a first end to form a first plurality of connecting pads. Terminating at a second end of the conductive traces are a second plurality of connecting pads. The first and second plurality of connecting pads corresponds respectively to the first and second plurality of conductive pads. Placing the flex circuit includes contacting the flex circuit with a head which is automated for movement. The flex circuit thereby becomes selectively coupled to the head. The position of the flex circuit is determined relative to the position of both the head and the rigid substrate. The head and the rigid substrate move relative to each other to align and place the first and second plurality of connecting pads respectively with the first and second plurality of conductive pads. The electronic components are electrically coupled to the first and second plurality of conductive traces forming respectively the primary PCB and the daughter PCB. The first and second plurality of connecting pads are electrically coupled respectively to the first and second plurality of conductive pads for electrically coupling the daughter PCB to the primary PCB.

In one aspect, the rigid substrate is positioned on an automated pick and place machine that has the head which is controllable within at least 3-axis for movement. At least one electronic component is placed along each of the first and second plurality of conductive traces via the automated pick and place machine. The position of the flex circuit is determined relative to the positions of both the head and the rigid substrate via the automated pick and place machine.

Further objects, features, and advantages of the invention will become apparent from consideration of the following description and the appended claims when taken in connection with the accompanying drawings.

BRIEF DESCRIPTION OF THE DRAWINGS

FIG. 4b is an enlarged view of a portion of the pick and place machine depicted in FIG. 4a;

DETAILED DESCRIPTION OF THE INVENTION

Detailed embodiments of the present invention are disclosed herein. It is understood however, that the detailed embodiments are merely exemplary of the invention and may be embodied in various and alternative forms. The figures are not necessarily to scale; some figure may be configured to show the details of a particular component. Therefore, specific structural and functional details disclosed herein are not to be interpreted as limiting but merely as a representative basis for the claims and for teaching one skilled in the art to practice the present invention.

Figure 1:
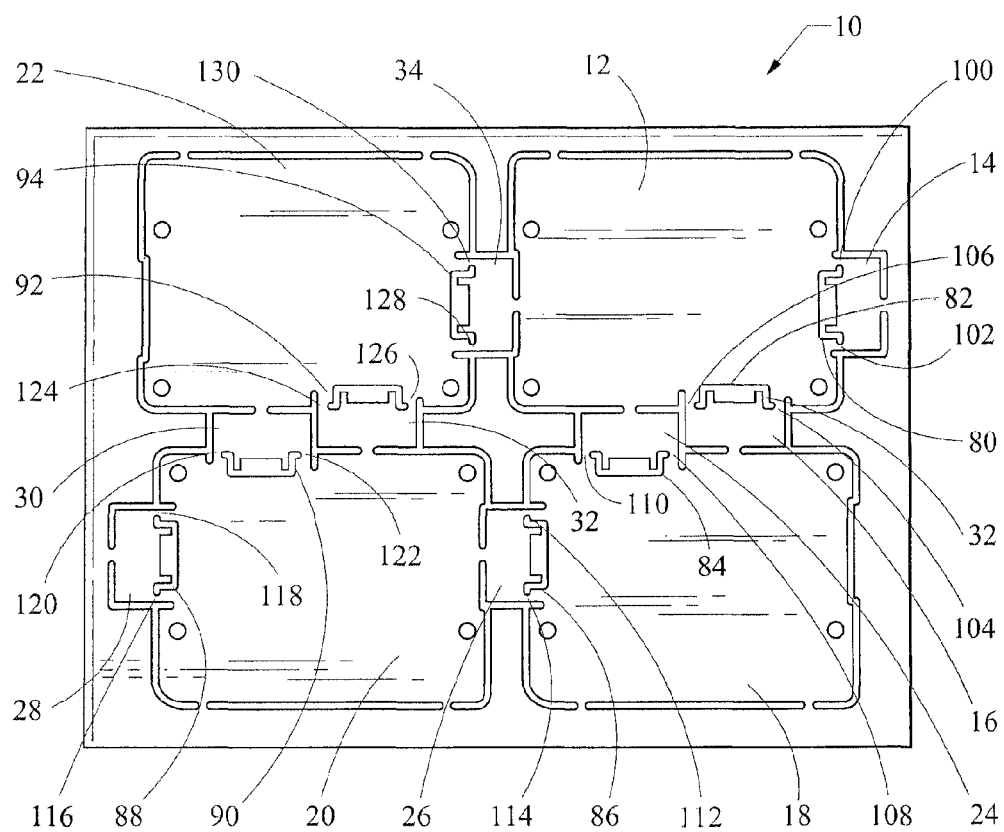
FIG. 1 is a plan view of a rigid substrate in accordance with an embodiment of the present invention.

Referring to FIG. 1, a substrate 10 for an electronic assembly is provided. The substrate 10 is a rigid substrate that may be formed from a ceramic material, such as for example, alumina. Alternatively, the substrate 10 may be formed from a rigid plastic composite material, such as for example, FR-4 glass/epoxy via a lamination process. Preferably, the substrate 10 has a substantially flat form of a plate or board.

The substrate 10 has a plurality of segmented portions 12, 14, 16, 18, 20, 22, 24, 26, 28, 30, 32, and 34 that are connected together. Each of the segmented portions 12, 14, 16, 18, 20, 22, 24, 26, 28, 30, 32, and 34 is a portion of the substrate 10 that is designated for a respective PCB. The segmented portions may include a plurality of primary segmented portions 12, 18, 20 and 22 each of which is for forming a primary PCB thereon. The primary segmented portions, which may be identical to each other, are correspondingly associated with a plurality of secondary segmented portions 14, 16, 24, 26, 28, 30, 32, and 34, which may be identical to each other, each of which is for forming a daughter PCB thereon. The secondary segmented portions may be smaller than the primary segmented portions. For example and as illustrated, the primary segmented portion 12 is associated with the smaller secondary segmented portions 14 and 16 which are arranged along a perimeter of the primary segmented portion 12.

The substrate 10 may also have a plurality of apertures 80, 82, 84, 86, 88, 90, 92 and 94 that are positioned between the primary segmented portions 12, 18, 20 and 22 and the secondary segmented portion 14, 16, 24, 26, 28, 30, 32, and 34. The apertures 80, 82, 84, 86, 88, 90, 92 and 94 are formed through the substrate, for example, by a post-laminating punching or cutting process such as routering or any other suitable material removal process for rigid PCB substrates known to those skilled in the art. Positioned adjacent to the apertures 80, 82, 84, 86, 88, 90, 92 and 94 are tabs 100, 102, 104, 106, 108, 110, 112, 114, 116, 118, 120, 122, 124, 126, 128, and 130 that connect the secondary segmented portions 14, 16, 24, 26, 28, 30, 32, and 34 to the primary segmented portions 12, 18, 20 and 22. As will become evident later, the apertures 80, 82, 84, 86, 88, 90, 92 and 94 facilitate the segmented portions 12, 14, 16, 18, 20, 22, 24, 26, 28, 30, 32, and 34 being subsequently disconnected from each other.

Figure 3:
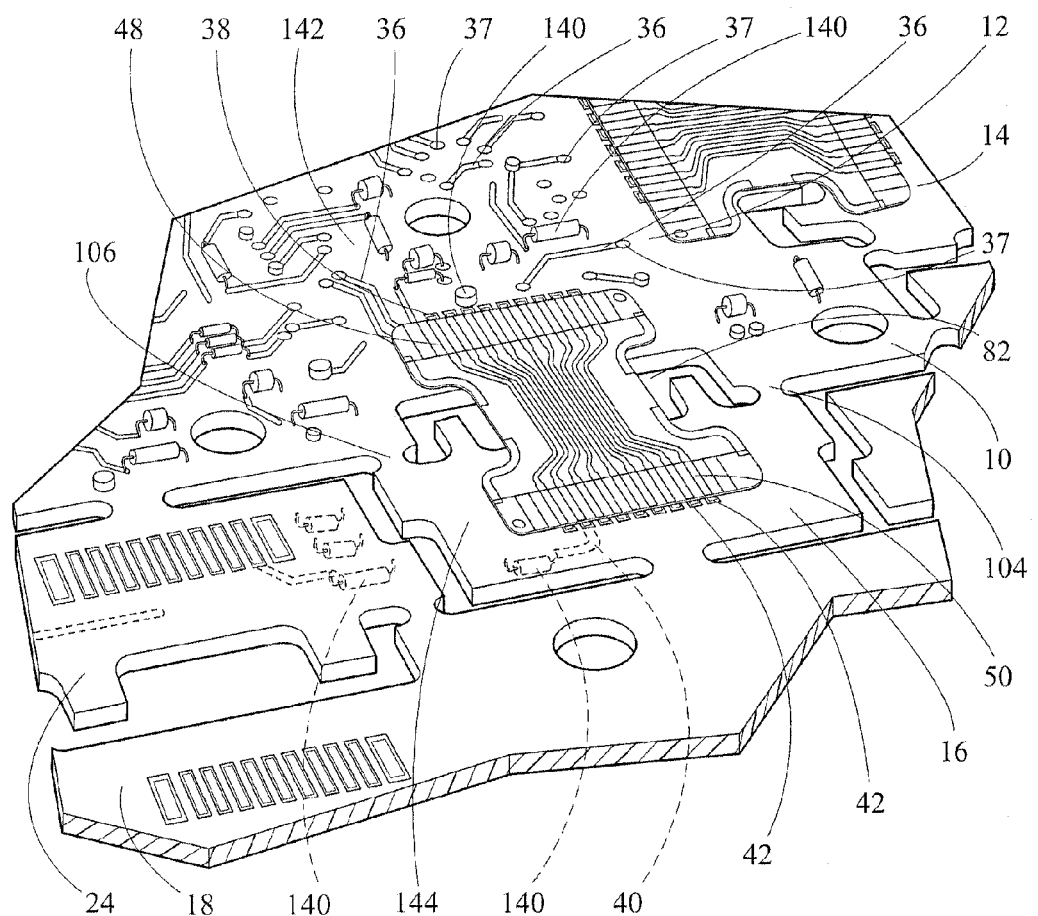
FIG. 3 is a partial perspective view of the electronic assembly in accordance with one embodiment of the present invention.

Referring also to FIG. 3, a partial perspective view of a primary and daughter PCBs 142 and 144 is provided. The primary segmented portion 12 (note—in this embodiment the primary portions are essentially identical with each other and the secondary segmented portions are essentially identical with each other) includes a plurality of conductive traces 36 that are formed on either or both sides of the substrate 10. Through-holes 37 or conductive pins may also be incorporated for providing electrical continuity between traces 36 on opposing sides of the portion 12. The conductive traces 36 terminate to form a plurality of conductive pads 38. The conductive traces 36 (including any through-holes 37), which are made from copper or the alike, may be formed on the substrate 10 via a selective plating and/or etching process or any other suitable process known in the art.

The secondary segmented portion 16 has a plurality of conductive traces 40 formed thereon. The conductive traces 40 of the secondary segmented portion 16 terminate to form a plurality of conductive pads 42. Preferably, the conductive traces 40 of the secondary segmented portion are formed on the substrate 10 via the same process for forming the conductive traces 36 of the primary segmented portion 12.

Electrically coupled to the conductive traces 36 and 40 of the primary and secondary segmented portions 12 and 16 are electronic devices 140, forming the primary PCB 142 and the daughter PCB 144 respectively. The electronic devices 140 may be surface mount devices (SMD) or any other suitable electronic device. Solder, solder paste or conductive adhesive or the alike may be used to electrically couple the electronic devices 140 to the conductive traces 36 and 40.

Figure 2A:
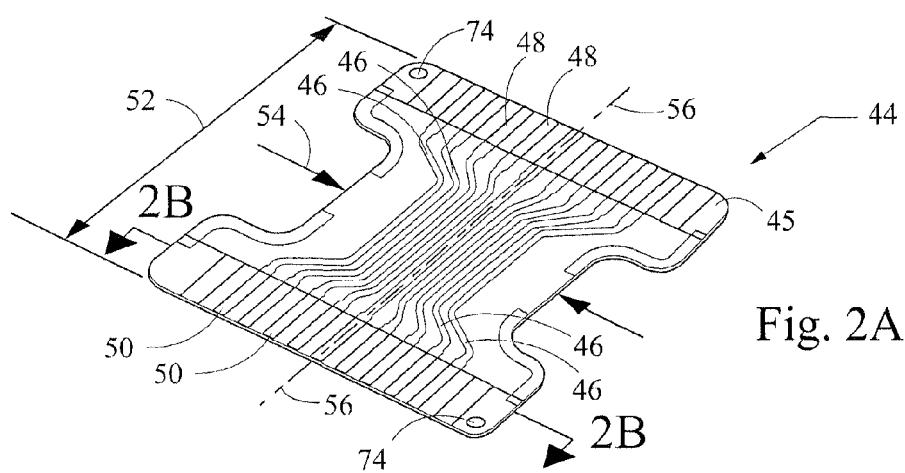
FIG. 2a is a perspective view of a flex circuit in accordance with one embodiment of the present invention.
Figure 2B:
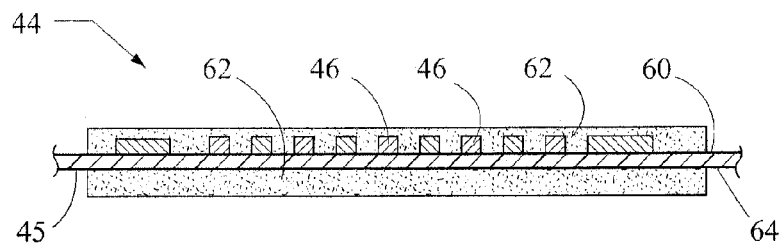
FIG. 2b is a sectional view of the flex circuit depicted in FIG. 2a along line 2b-2b.

Referring also to FIGS. 2a and 2b, a perspective view and a sectional view of a flex circuit 44 are provided. The flex circuit 44 includes a plurality of conductive traces 46 formed on a flexible film carrier 45. The film carrier 45 may be made of polyimide, polyester, PEI or any other suitable polymeric film for flex circuits known to those skilled in the art. The thickness of the film carrier 45 is typically in the range of about 1 to 10 mils and the conductive traces may be made from about ½ to 2 oz copper. Preferably, the film carrier 45 can withstand short durations (minutes) of heat exposure from a soldering process, e.g., >180° C., without degrading or becoming dimensionally unstable, e.g., warping.

The conductive traces 46 terminate at a first end to form a first plurality of connecting pads 48 and terminate at a second end to form a second plurality of connecting pads 50. The first and second plurality of connecting pads 48 and 50 are matched and aligned respectively with the conducting pads 38 and 42 formed on the primary and secondary segmented portions 12 and 16 and are electrically coupled thereto (see FIG. 3), forming an electrical interconnection between the primary and daughter PCBs 142 and 144. The connecting pads 48 and 50 are electrically coupled to the connecting pads 38 and 42 via solder, conductive adhesive or the alike. The flex circuit 44 preferably has fiducials 74, i.e., locating features, formed thereon, which will be discussed in further detail below. Note—as illustrated in FIG. 2a, the fiducials 74 may be distinct features from the traces 46 and pads 50. However, as is well known in the art, a fiducial is understood to be any locating feature used for generating an alignment window for positioning the flex circuit 44 including the traces 46, pads 50, and/or the perimeter outline of the flex circuit 44.

Preferably, the flex circuit 44 is relatively flat in a free or unrestrained state to facilitate automated assembly of the flex circuit 44 onto the conducting pads 38 and 42. In one example, the flex circuit 44 in a free state is within about 10 mils deviation from its nominally flat condition. Applicants have discovered several means to enhance the flatness of the flex circuit 44 in its free state and thus, minimize deviations from its nominally flat condition. In one aspect, the flex circuit 44 has a length 52 not exceeding about 35 mm. In another aspect, the flex circuit 44 has a length 52 to minimum width 54 defining an aspect ratio that does not exceed about 5:1 and more preferably, does not exceed about 2:1. In a further aspect, the flex circuit 44 has a central longitudinal axis 56 extending between the first and second ends 48 and 50 and the plurality of conductive traces 46 are symmetrically arranged about the longitudinal axis 56. In yet another aspect, the film carrier 45 has a thickness of at least 5 mils and the plurality of conductive traces 46 are at least 1 oz copper formed on the film carrier 45. In another aspect, the flex circuit 44 includes a solder mask 62 attached to opposing sides 60 and 64 of the flex circuit 44. The solder mask 62 is an electrically resistive coating or covering for preventing an electrical short from occurring with the conductive traces 46 of the flex circuit 44. It is believed that the aspects mentioned above, help to balance some or many of the stresses produced on the opposing sides 60 and 64 of the film carrier 45 and thus, improve dimensional stability of the flex circuit 44.

Figure 4A:
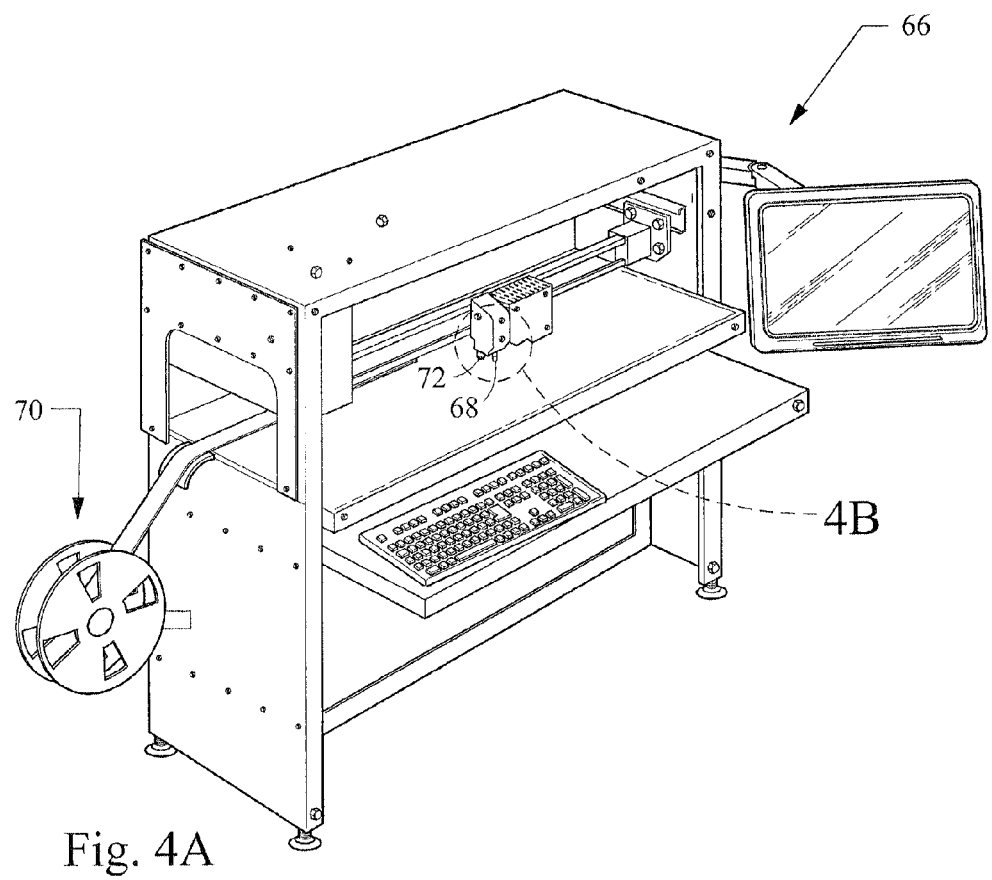
FIG. 4a is a perspective view of a pick and place machine in accordance with an embodiment of the present invention.
Figure 4B:
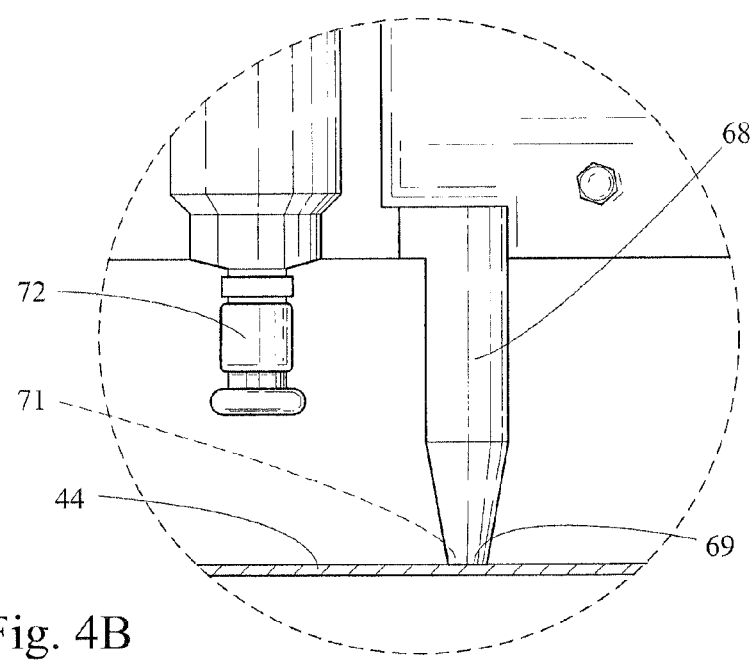
Figure 6:
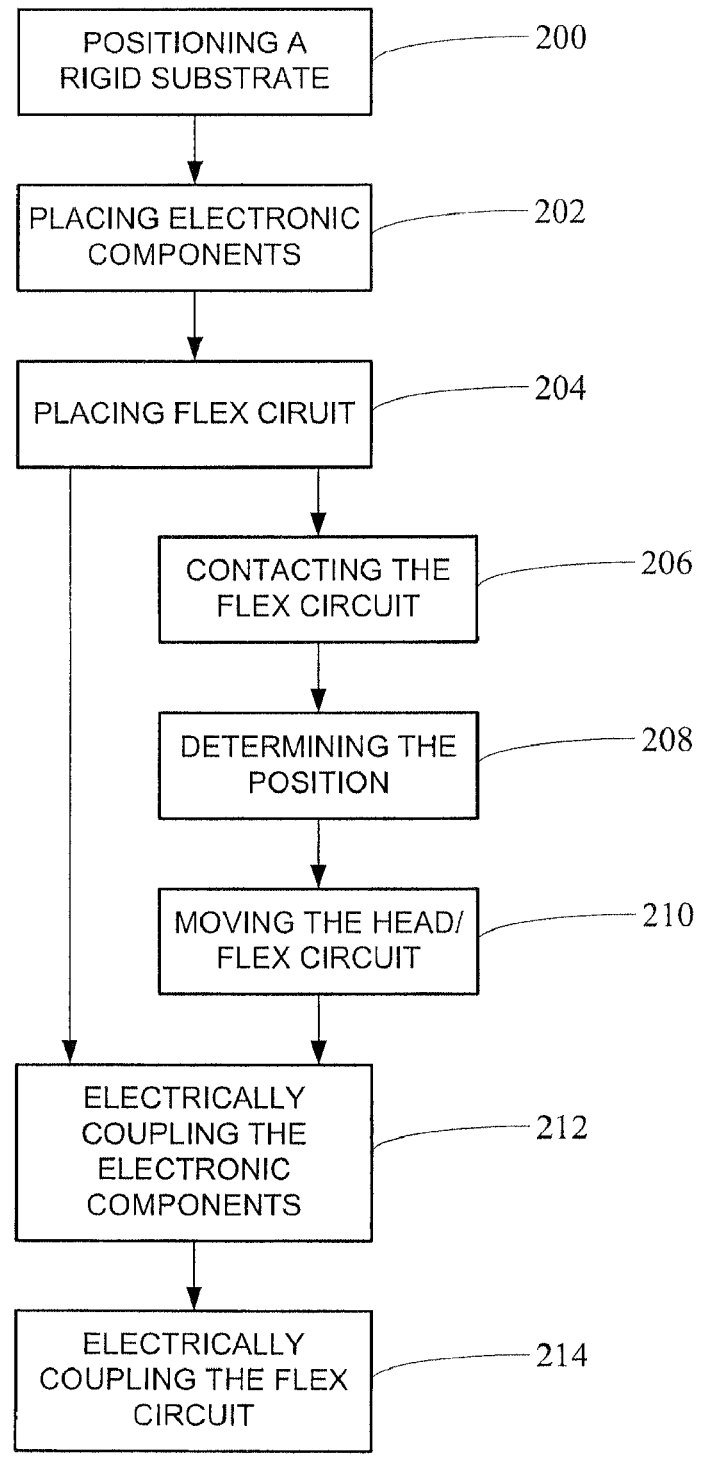
FIG. 6 is a flow chart for a method of making an electronic assembly in accordance with an embodiment of the present invention.

Referring also to FIGS. 4a-4b and 6, a method for making an electronic assembly is provided. The substrate 10 is positioned at 200 on an automated pick and place machine 66. The substrate 10 may be positioned on the pick and place machine either manually or automatically. The pick and place machine 66 has a head 68. Preferably, the substrate 10 is positioned proximate to the head 68, e.g., located underneath the head 68.

The head 68 is controllable within at least 3-axis for movement, e.g., up-down, fore-aft, and side to side. For example, the head 68 may be operably connected to a rail-gantry arrangement that interfaces with a computer numerical control (CNC) system for 3-axis movement. Other suitable automated systems may be employed for controlling the movement of head 68 that are known to those skilled in the art.

In one example, the head 68 is configured as a nozzle that is in selective fluid communication with a vacuum source. The head 68 pulls a vacuum (sucks) to pick up electronic components 140 from a tape and reel arrangement 70 and places them at 202 onto the substrate 10. Once the electronic component 140 is properly positioned on the substrate 10, fluid communication between the vacuum source and the head 68 is interrupted to release the component 140 from the head 68. Solder paste and/or a conductive adhesive may be disposed between the electrical components 140 and the conductive traces 36 and 42 for subsequent processing, e.g., reflow soldering, to form the respective primary PCB 142 and daughter PCB 144.

In one embodiment, the substrate 10 has fiducials, e.g., locating features, formed thereon. A camera 72 is included on the pick and place machine 66 that is configured for detecting the fiducials for determining the position of the substrate 10. The pick and place machine 66 uses the information obtained from the camera 72 to position and control the head 68 for placing the electronic components 140 onto the substrate 10.

The pick and place machine 66 also places at 204 the flex circuit 44 onto the conductive pads 38 and 42. This step includes contacting at 206 the flex circuit 44 with the head 68 to selectively couple the flex circuit 44 to the head 68. For example, in the scenario where the head 68 is in the form of a nozzle, the nozzle 68 pulls a vacuum to pick up the flex circuit 44 from the tape and reel arrangement 70 (note—plurality of flex circuits 44 may be taped and reeled and provided to the pick and place machine 66 in this arrangement). In particular, a perimeter portion 69 of the nozzle 68 that is adjacent to the nozzle's vacuum opening 71 touches the flex circuit 44 and the vacuum holds the flex circuit 44 directly against the perimeter portion 69. Preferably, the flex circuit 44 remains substantially flat while positioned against the nozzle/head 68 to facilitate placement of the flex circuit 44 onto the conductive pads 38 and 42.

The pick and place machine 66 then determines at 208 the position of the flex circuit 44 relative to the positions of both the head 68 and the substrate 10, e.g., via the camera 72, an associated processor (not shown) and the fiducials 74 (or any other locating features). The pick and place machine 66 moves at 210 the head 68 and the substrate 10 relative to each other to align and place the connecting pads 48 and 50 of the flex circuit 44 with the conductive pads 38 and 42. As mentioned above, solder paste or conductive adhesive may be positioned between the connecting pads 48 and 50 and the conducting pads 38 and 42, e.g., screening solder paste onto the substrate 10 to locally deposit the solder paste about the conducting pads 38 and 42.

In one embodiment, the substrate 10, which is assembled with the electronic devices 140 and the flex circuits 44, is exposed to a reflow oven having a temperature greater than about 180° C. The elevated temperature melts the solder paste or cures the conductive adhesive. The solder paste or conductive adhesive is cooled to form solder joints which electrically couple the components 140 to the traces 36 and 42 (at 212) and the connecting pads 48 and 50 to the conducting pads 38 and 42 (at 214). Accordingly, a single substrate 10 having multiple primary segmented portions 12, 18, 20 and 22 associated with multiple secondary segmented portions 14, 16, 24, 26, 28, 30, 32 and 34 may be constructed as discussed in the foregoing paragraphs to provide a plurality of electronic assemblies where each of the assemblies includes a primary PCB 142 electrically coupled to at least one daughter PCB 144.

As illustrated in FIG. 2a, the flex circuit 44 may have a substantially dog-bone shape. It is believed that the dog-bone shape with the reduced central width 54 in combination with the low flexural modulus of the flex carrier 45 provides more flexibility or compliance at the ends of the flex circuit 44 with the connecting pads 48 and 50 and thereby reduces residual stress in the solder joints.

Optionally, the electronic assemblies, while still integrally attached to each other via tabs 100, 102, 104, 106, 108, 110, 112, 114, 116, 118, 120, 122, 124, 126, 128, and 130, may then be electronically tested, e.g., continuity testing, functional testing, or alike. It is believed that testing the PCBs at this early stage of production will improve manufacturing efficiency and reduce production cost by allowing for both earlier detection of problem PCBs and multiple PCBs being tested in a single test sampling.

The method further includes disconnecting the primary segmented portions 12, 18, 20 and 22 and the secondary segmented portions 14, 16, 24, 26, 28, 30, 32 and 34 from each other, e.g., by simply die cutting, routering, or milling the tabs 100, 102, 104, 106, 108, 110, 112, 114, 116, 118, 120, 122, 124, 126, 128, and 130 of the substrate 10.

Figure 5:
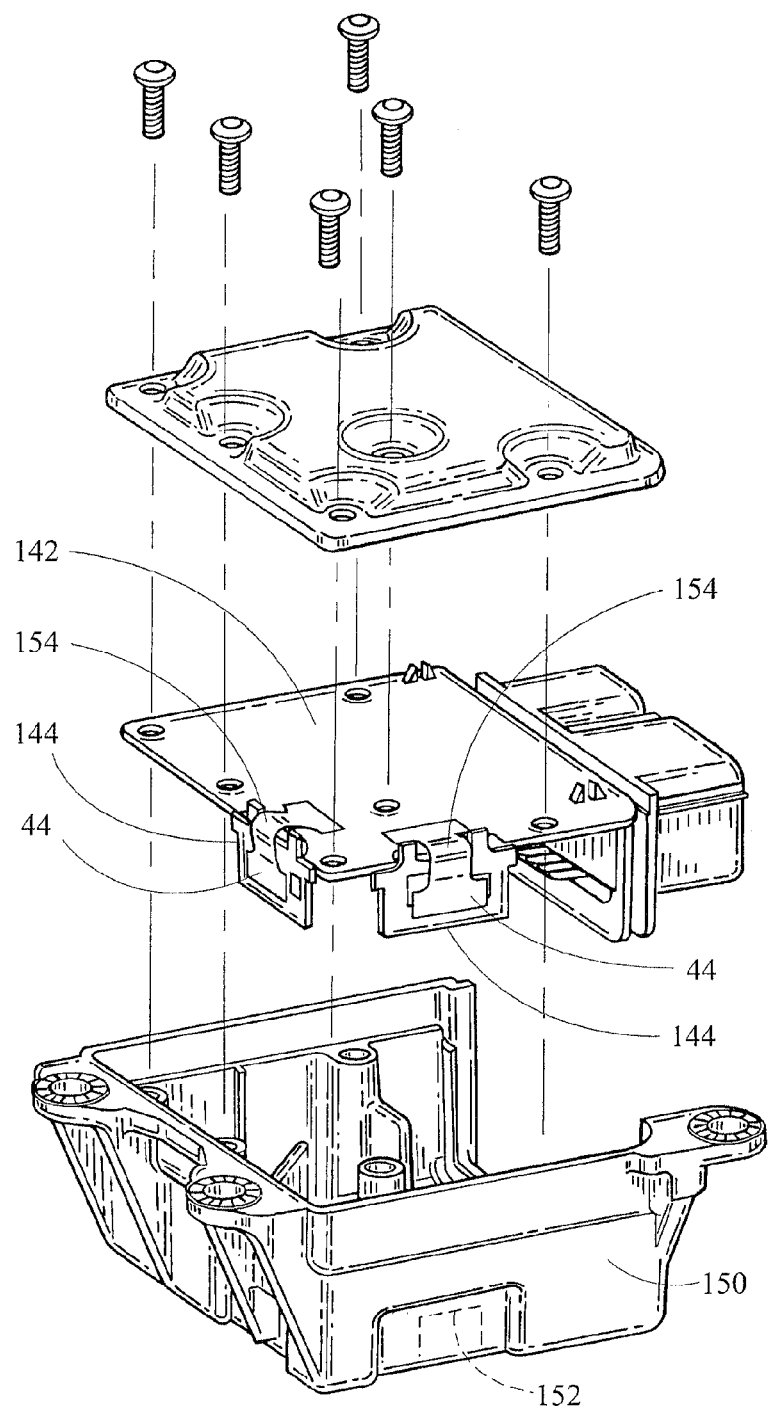
FIG. 5 is an exploded view of the electronic assembly in accordance with one embodiment of the present invention.

Referring also to FIG. 5, the electronic assembly may further include a housing element 150, which in this embodiment is a tub-shaped housing. The housing 150 has at least one receiving feature 152, e.g., pocket or slot. The receiving features 152 are adapted to receive the daughter PCBs 144. The primary PCB 142 and the daughter PCBs 144 are mounted to the housing 150. The daughter PCBs 144 are spaced apart from and oriented at a substantially right angle to the primary PCB 142 such that each of the flex circuits 44 forms a loop 154. This arrangement allows the daughter PCBs 144 to be mechanically decoupled from the primary PCB 142 and is particularly suitable for an electronic sensor assembly used to detect vehicle attitude. For example, each of the daughter PCBs 144 may be adapted to sense acceleration through the use of an accelerometer. One daughter PCB 144 senses change in roll angle through a roll angular rate sensor and the other daughter PCB 144 senses pitch angle through a pitch angular rate sensor. Other suitable application may also be used for an electronic assembly arranged with mechanically decoupled daughter PCBs from a primary PCB.

Accordingly, the method may further comprise mounting the primary PCB 142 and the daughter PCB 144 to a housing 150. The daughter PCB 144 is positioned at substantially a right angle to the primary PCB 142 and the flex circuit 44 forms a loop 154, thereby mechanically decoupling the daughter PCB 144 from the primary PCB 142.

As a person skilled in the art will readily appreciate, the above description is meant as an illustration of the implementation of the principles of this invention. This description is not intended to limit the scope or application of this invention in that the invention is susceptible to modification, variation, and change, without departing from the spirit of this invention, as defined in the following claims.

The invention claimed is:

1. A method for making an electronic assembly that includes a primary printed circuit board (PCB) and at least one daughter PCB electrically coupled to the primary PCB, the method comprising:
    positioning a rigid substrate having a plurality of segmented portions connected together including a first segmented portion and second segmented portion, the first segmented portion having a first plurality of conductive traces terminating to form a first plurality of conductive pads, the second segmented portion having a second plurality of conductive traces terminating to form a second plurality of conductive pads;

placing at least one electronic component along each of the first and second plurality of conductive traces;

placing a flex circuit onto the first and second plurality of conductive pads, the flex circuit including a third plurality of conductive traces terminating at a first end to form a first plurality of connecting pads and terminating at a second end to form a second plurality of connecting pads, the first and second plurality of connecting pads correspond respectively to the first and second plurality of conductive pads, placing the flex circuit including:

contacting the flex circuit with a head to selectively couple the flex circuit to the head, the head being automated for movement;

determining the position of the flex circuit relative to the positions of both the head and the rigid substrate; and moving the head and the rigid substrate relative to each other to align and place the first and second plurality of connecting pads respectively with the first and second plurality of conductive pads;

electrically coupling the electronic components to the first and second plurality of conductive traces forming respectively the primary PCB and the daughter PCB; and electrically coupling the first and second plurality of connecting pads respectively to the first and second plurality of conductive pads for electrically coupling the daughter PCB to the primary PCB.

2. The method according to claim 1 wherein the step of placing the flex circuit is performed using an automated pick and place machine which includes the head controllable within at least 3-axis for movement.

3. The method according to claim 2 wherein the head is configured as a nozzle that is in selective fluid communication with a vacuum source and the step of contacting the flex circuit includes picking the flex circuit from a tape and reel arrangement via the nozzle.

4. The method according to claim 2 wherein the step of placing the electronic components is performed using the automated pick and place machine.

5. The method according to claim 2 wherein the rigid substrate and the flex circuits each have at least one fiducial, and the automated pick and place machine includes a vision system for detecting the fiducials, and the step of determining the position includes detecting the fiducials and determining the position of the fiducials via the automated pick and place machine.

6. The method according to claim 1 wherein the rigid substrate is substantially flat and the flex circuit is substantially flat when being placed onto the first and second plurality of conductive pads.

7. The method according to claim 6 wherein the flex circuit has a length not exceeding about 35 mm, enhancing flatness of the flex circuit.

8. The method according to claim 6 wherein the flex circuit has a length to minimum width defining an aspect ratio not exceeding about 5 to 1, enhancing flatness of the flex circuit.

9. The method according to claim 8 wherein the aspect ratio does not exceed about 2 to 1, further enhancing flatness of the flex circuit.

10. The method according to claim 6 wherein the flex circuit has a central longitudinal axis extending between the first and second ends and the third plurality of conductive traces are symmetrically configured about the longitudinal axis, enhancing flatness of the flex circuit.

11. The method according to claim 6 wherein the flex circuit includes a flexible film having a thickness of at least about 5 mils and the third plurality of conductive traces are at least 1 ounce copper formed on a surface of the flexible film, enhancing flatness of the flex circuit.

12. The method according to claim 6 wherein the flex circuit includes a solder mask attached to opposing sides of the flex circuit, enhancing flatness of the flex circuit and providing a resistive covering to the third plurality of conductive traces.

13. The method according to claim 1 wherein the rigid substrate has at least one aperture formed therethrough positioned between the first and second plurality of conductive pads, the flex circuit extending across the aperture.

14. The method according to claim 13 wherein the rigid substrate has at least one tab formed adjacent to the aperture for connecting the first and second segmented portions together.

15. The method according to claim 1 further comprising disconnecting the first and second segmented portions by at least one of die cutting, routering and milling the rigid substrate subsequent to the steps of electrically coupling the electronic components and electrically coupling the first and second plurality of connecting pads.

16. The method according to claim 15 further comprising electronically testing the electronic assembly subsequent to the steps of electrically coupling the electronic components and electrically coupling the first and second plurality of connecting pads but prior to the step of disconnecting the first and second segmented portions.

17. The method according to claim 15 further comprising mounting the primary PCB and the daughter PCB to a housing such that the daughter PCB is positioned substantially perpendicular to the primary PCB and the flex circuit forms a loop, mechanically decoupling the daughter PCB from the primary PCB.

18. The method according to claim 1 further comprising screening solder paste onto the rigid substrate to locally deposit the solder paste about the first and second plurality of conductive pads and the step of electrically coupling the first and second plurality of connecting pads includes:

heating the solder paste within a reflow oven to form melted solder paste; and cooling the melted solder paste to form a plurality of solder joints that electrically couple the flex circuit to the first and second plurality of conductive pads.

19. The method according to claim 18 wherein the flex circuit has a substantially "dog bone" shape, enhancing compliance of the flex circuit proximate the first and second ends and reducing residual stress in the solder joints.

20. A method for making an electronic assembly that includes a primary printed circuit board (PCB) and at least one daughter PCB electrically coupled to the primary PCB, the method comprising:

positioning a rigid substrate on an automated pick and place machine that has a head controllable within at least 3-axis for movement, the rigid substrate having a plurality of segmented portions connected together including a first segmented portion and second segmented portion, the first segmented portion having a first plurality of conductive traces terminating to form a first plurality of conductive pads, the second segmented portion having a second plurality of conductive traces terminating to form a second plurality of conductive pads;

placing at least one electronic component along each of the first and second plurality of conductive traces via the automated pick and place machine;

placing a flex circuit onto the first and second plurality of conductive pads, the flex circuit including a third plurality of conductive traces terminating at a first end to form a first plurality of connecting pads and terminating at a second end to form a second plurality of connecting pads, the first and second plurality of connecting pads correspond respectively to the first and second plurality of conductive pads, placing the flex circuit including:
- contacting the flex circuit with the head to selectively couple the flex circuit to the head;
- determining the position of the flex circuit relative to the positions of both the head and the rigid substrate via the automated pick and place machine; and
- moving the head and the rigid substrate relative to each other to align and place the first and second plurality of connecting pads respectively with the first and second plurality of conductive pads;

electrically coupling the electronic components to the first and second plurality of conductive traces forming respectively the primary PCB and the daughter PCB; and electrically coupling the first and second plurality of connecting pads respectively to the first and second plurality of conductive pads for electrically coupling the daughter PCB to the primary PCB.

21. The method according to claim 20 wherein the rigid substrate is substantially flat and the flex circuit is substantially flat when being placed onto the first and second plurality of conductive pads.

22. The method according to claim 21 wherein the flex circuit has a length to minimum width defining an aspect ratio not exceeding about 2 to 1, enhancing flatness of the flex circuit.

23. The method according to claim 21 wherein the flex circuit has a central longitudinal axis extending between the first and second ends and the third plurality of conductive traces are symmetrically configured about the longitudinal axis, enhancing flatness of the flex circuit.

24. The method according to claim 21 wherein the flex circuit includes a solder mask attached to opposing sides of the flex circuit, enhancing flatness of the flex circuit and providing a resistive covering to the third plurality of conductive traces.

25. The method according to claim 20 further comprising disconnecting the first and second segmented portions by at least one of die cutting, routering and milling the rigid substrate subsequent to the steps of electrically coupling the electronic components and electrically coupling the first and second plurality of connecting pads.

26. The method according to claim 25 further comprising mounting the primary PCB and the daughter PCB to a housing such that the daughter PCB is positioned substantially perpendicular to the primary PCB and the flex circuit forms a loop, mechanically decoupling the daughter PCB from the primary PCB.

27. The method according to claim 20 further comprising screening solder paste onto the rigid substrate to locally deposit the solder paste about the first and second plurality of conductive pads and the step of electrically coupling the first and second plurality of connecting pads includes:
- heating the solder paste within a reflow oven to form melted solder paste; and
- cooling the melted solder paste to form a plurality of solder joints that electrically couple the flex circuit to the first and second plurality of conductive pads.

28. The method according to claim 18 wherein the flex circuit has a substantially "dog bone" shape, enhancing compliance of the flex circuit proximate the first and second ends and reducing residual stress in the solder joints.

* * * * *